(12) United States Patent
Sun et al.

(10) Patent No.: US 11,706,992 B2
(45) Date of Patent: Jul. 18, 2023

(54) FLEXIBLE BODY AND METHOD FOR CONTROLLING FLEXIBLE BODY TO DEFORM

(71) Applicants: FUZHOU BOE OPTOELECTRONICS TECHNOLOGY CO., LTD., Fuzhou (CN); BOE TECHNOLOGY GROUP CO., LTD., Beijing (CN)

(72) Inventors: Xiaowu Sun, Beijing (CN); Junxiang Lu, Beijing (CN); Jie Huang, Beijing (CN); Jianshu Wang, Beijing (CN); Peitao Zhu, Beijing (CN); Yajiao Zhang, Beijing (CN); Ting Chen, Beijing (CN); Song Hu, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 512 days.

(21) Appl. No.: 16/646,133

(22) PCT Filed: Sep. 27, 2019

(86) PCT No.: PCT/CN2019/108738
§ 371 (c)(1),
(2) Date: Mar. 10, 2020

(87) PCT Pub. No.: WO2020/140501
PCT Pub. Date: Jul. 9, 2020

(65) Prior Publication Data
US 2021/0226117 A1    Jul. 22, 2021

(30) Foreign Application Priority Data
Jan. 2, 2019 (CN) .......................... 201910001040.0

(51) Int. Cl.
*H01L 41/08* (2006.01)
*H10N 39/00* (2023.01)
(Continued)

(52) U.S. Cl.
CPC ........... *H10N 39/00* (2023.02); *H02N 2/0075* (2013.01); *H10N 30/20* (2023.02); *H10N 30/802* (2023.02); *H10N 30/857* (2023.02)

(58) Field of Classification Search
CPC ..... H01L 27/20; H01L 27/32; H01L 27/3202; H01L 27/3204; H01L 27/3225;
(Continued)

(56) References Cited

U.S. PATENT DOCUMENTS 7,514,850 B2    4/2009    Asai
7,733,000 B2    6/2010    Kudoh
(Continued)

FOREIGN PATENT DOCUMENTS

CN    101053146 A    10/2007
CN    101828330 A    9/2010
(Continued)

OTHER PUBLICATIONS

Second Chinese Office Action dated Jan. 19, 2023, for corresponding Chinese Application No. 201910001040.0.

*Primary Examiner* — Eduardo A Rodela
(74) *Attorney, Agent, or Firm* — Kinney & Lange, P.A.

(57) ABSTRACT

Provided are a flexible body and a method for controlling the flexible body to deform. The flexible body comprises one or more flexible units, wherein each of the flexible units comprises: a first electrode, a second electrode, an electroactive polymer layer, and a thin film transistor, wherein a source electrode or a drain electrode of the thin film transistor is electrically connected to the second electrode. The first electrode and the second electrode are configured to
(Continued)

provide an electric field acting on the electroactive polymer layer, and the electroactive polymer layer is configured to deform in response to the electric field provided by the first electrode and the second electrode.

18 Claims, 3 Drawing Sheets

(51) Int. Cl.
    *H02N 2/00*     (2006.01)
    *H10N 30/857*     (2023.01)
    *H10N 30/20*     (2023.01)
    *H10N 30/80*     (2023.01)

(58) Field of Classification Search
    CPC . H01L 27/323; H01L 27/3248; H01L 41/042; H01L 41/0815; H01L 41/09; H01L 41/193; H02N 2/0075
    See application file for complete search history.

(56) References Cited

U.S. PATENT DOCUMENTS

| | | | |
|---|---|---|---|
| 8,222,799 B2 | 7/2012 | Polyakov et al. | |
| 9,231,186 B2 | 1/2016 | Büsgen et al. | |
| 9,397,360 B2 | 7/2016 | Ishida et al. | |
| 10,115,884 B2 | 10/2018 | Shi et al. | |
| 10,181,806 B2 | 1/2019 | Kajino | |
| 10,423,260 B2* | 9/2019 | Naganuma | H01L 51/5225 |
| 10,624,582 B2 | 4/2020 | Liu | |
| 10,796,127 B2* | 10/2020 | Park | G06F 21/32 |
| 11,373,428 B2* | 6/2022 | Moon | G06V 40/1306 |
| 2001/0036790 A1 | 11/2001 | Kornbluh et al. | |
| 2005/0105784 A1* | 5/2005 | Nam | G06V 40/1306 382/124 |
| 2007/0205701 A1 | 9/2007 | Grumm | |
| 2008/0169729 A1 | 7/2008 | Asai | |
| 2010/0039001 A1 | 2/2010 | Kudoh | |
| 2010/0109486 A1 | 5/2010 | Polyakov et al. | |
| 2012/0128960 A1 | 5/2012 | Buesgen et al. | |
| 2012/0276462 A1 | 11/2012 | Ishida et al. | |
| 2013/0309791 A1* | 11/2013 | Bedell | H01L 21/84 257/E33.056 |
| 2016/0226404 A1 | 8/2016 | Kajino | |
| 2016/0372652 A1 | 12/2016 | Shi et al. | |
| 2017/0133937 A1 | 5/2017 | Jeong et al. | |
| 2017/0273624 A1 | 9/2017 | Liu | |
| 2017/0322291 A1 | 11/2017 | Salvia et al. | |
| 2017/0364726 A1* | 12/2017 | Buchan | G06V 40/1306 |
| 2018/0266401 A1* | 9/2018 | van den Ende | B26B 19/28 |
| 2019/0116405 A1* | 4/2019 | Noh | G06F 1/1637 |
| 2019/0163314 A1* | 5/2019 | Kim | G06F 3/0416 |
| 2019/0251378 A1* | 8/2019 | Jung | B06B 1/0629 |
| 2019/0393278 A1* | 12/2019 | Wu | H01L 27/3225 |

FOREIGN PATENT DOCUMENTS

| | | |
|---|---|---|
| CN | 102272959 A | 12/2011 |
| CN | 102460756 A | 5/2012 |
| CN | 102759786 A | 10/2012 |
| CN | 104523285 A | 4/2015 |
| CN | 104536187 A | 4/2015 |
| CN | 105846717 A | 8/2016 |
| WO | 2018007441 A1 | 1/2018 |

* cited by examiner

US 11,706,992 B2

FLEXIBLE BODY AND METHOD FOR CONTROLLING FLEXIBLE BODY TO DEFORM

CROSS REFERENCE TO RELATED APPLICATION(S)

The present application is a Section 371 National Stage Application of International Application No. PCT/CN2019/108738, filed Sep. 27, 2019, entitled "FLEXIBLE BODY AND METHOD FOR CONTROLLING FLEXIBLE BODY TO DEFORM", which claims a priority to Chinese Patent Application No. 201910001040.0, filed on Jan. 2, 2019, with a title of "Flexible body and method for controlling flexible body to deform", the entirety of which is incorporated herein by reference.

TECHNICAL FIELD

The present application relates to a flexible body and a method for controlling the flexible body to deform.

BACKGROUND

In recent years, artificial intelligence becomes a focus of science and technology worldwide. Various new robots based on the artificial intelligence technology are developed continuously and widely used in industrial production and daily life. In order to realize a function of walking or local deformation, current robots and other similar electrical devices generally need to use an artificial muscle, and thus a motor or a hydraulic system is required for control. However, the motor or hydraulic system will cause the whole system to be relatively cumbersome, thereby limiting the flexibility, strength and overall working performance.

SUMMARY

Embodiments of the present disclosure provide a flexible body comprising one or more flexible units. Each of the flexible units comprises: a first electrode, a second electrode, an electroactive polymer layer, and a thin film transistor. A source electrode or a drain electrode of the thin film transistor is electrically connected to the second electrode. The first electrode and the second electrode are configured to provide an electric field acting on the electroactive polymer layer, and the electroactive polymer layer is configured to deform in response to the electric field provided by the first electrode and the second electrode.

According to some embodiments of the present disclosure, the first electrode and the second electrode are respectively arranged on either side of the electroactive polymer layer, or the first electrode and the second electrode are arranged on the same side of the electroactive polymer layer.

According to some embodiments of the present disclosure, the electroactive polymer layer comprises an electron-type electroactive polymer or an ion-type electroactive polymer.

According to some embodiments of the present disclosure, the electroactive polymer layer comprises an ion-type electroactive polymer, and the flexible unit further comprises an electrolyte solution layer in contact with the electroactive polymer layer.

According to some embodiments of the present disclosure, the electroactive polymer layer comprises N electroactive polymer sub-layers, the electrolyte solution layer comprises N−1 electrolyte solution sub-layers, and each of the electrolyte solution sub-layers is arranged between two adjacent electroactive polymer sub-layers, wherein N is an integer greater than 1.

According to some embodiments of the present disclosure, the electroactive polymer layer comprises M electroactive polymer sub-layers, the electrolyte solution layer comprises M or M+1 electrolyte solution sub-layers, and the electrolyte solution sub-layers and the electroactive polymer sub-layers are alternately arranged, wherein M is a positive integer.

According to some embodiments of the present disclosure, the electroactive polymer layer comprises an ion-type electroactive polymer and is doped with a movable anion.

According to some embodiments of the present disclosure, the flexible unit further comprises a first insulating layer overlaying the thin film transistor, wherein the second electrode is formed on a side of the first insulating layer away from the thin film transistor, the first insulating layer is provided with a via hole, and the source electrode or drain electrode of the thin film transistor is electrically connected to the second electrode through the via hole.

According to some embodiments of the present disclosure, the flexible unit comprises a thin film transistor array composed of a plurality of thin film transistors, a second electrode array composed of a plurality of second electrodes, and one or more first electrodes. The source electrode or drain electrode of each thin film transistor in the thin film transistor array is electrically connected to one respective second electrode in the second electrode array, and the plurality of second electrodes in the second electrode array are arranged separately and respectively corresponding to different positions of the electroactive polymer layer.

According to some embodiments of the present disclosure, one first electrode together with at least two second electrodes provides an electric field acting on the electroactive polymer layer.

According to some embodiments of the present disclosure, the flexible unit further comprises a data voltage generator configured to be electrically connected to the source electrodes or drain electrodes of the plurality of thin film transistors in the thin film transistor array to provide different first voltages to the second electrodes.

According to some embodiments of the present disclosure, the flexible body comprises a plurality of flexible units arranged along an extending direction of the electroactive polymer layer.

According to some embodiments of the present disclosure, the first electrode is a common electrode.

According to some embodiments of the present disclosure, the flexible body comprises a plurality of flexible units arranged in lamination in a direction perpendicular to an extending direction of the electroactive polymer layer.

According to some embodiments of the present disclosure, the flexible body is for use in an artificial muscle, an artificial limb, a massage chair, or a transmitter.

Other embodiments of the present disclosure provide a method for controlling the flexible body according to any one of the preceding embodiments to deform, comprising:
  applying a first voltage to the source electrode or drain electrode of the thin film transistor;
  applying a second voltage to the first electrode;
  changing the first voltage to modulate the electric field acting on the electroactive polymer layer, thereby controlling the flexible body to deform accordingly.

According to some embodiments of the present disclosure, the flexible unit comprises a thin film transistor array composed of a plurality of thin film transistors, a second electrode array composed of a plurality of second electrodes, one or more first electrodes, and a data voltage generator electrically connected to the source electrodes or drain electrodes of the plurality of thin film transistors in the thin film transistor array, and the method comprises: providing different first voltages to the plurality of thin film transistors by the data voltage generator; applying the second voltage to the one or more first electrodes; changing the first voltage provided by the data voltage generator to modulate the electric field acting on the electroactive polymer layer, thereby controlling the flexible body to deform accordingly.

According to some embodiments of the present disclosure, the flexible body comprises a plurality of flexible units, and the method comprises: providing different first voltages to the thin film transistors in one respective flexible unit by a plurality of data voltage generators respectively; applying the second voltage to the first electrode; changing the first voltages provided by the plurality of data voltage generators to modulate the electric field acting on the electroactive polymer layer, thereby controlling the flexible body to deform accordingly.

DETAILED DESCRIPTION

Particular embodiments of the present disclosure will be described in detail below by way of examples. It should be understood that the embodiments of the present disclosure are not limited to examples set forth below. Those skilled in the art can change or modify the embodiments by making use of the principle or spirit of the present disclosure to obtain other embodiments in different forms which obviously fall within the scope of the present application.

Figure 1:
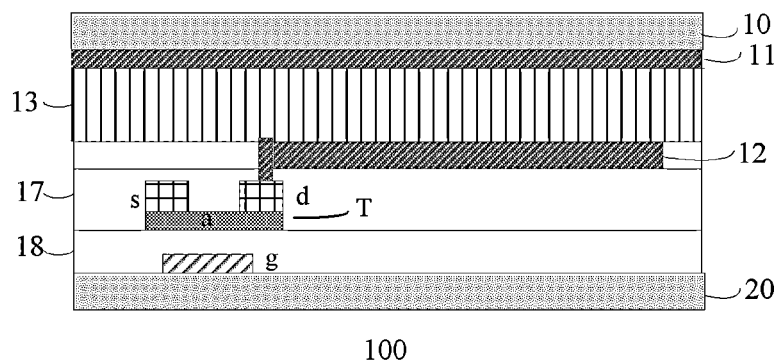
FIG. 1 shows a schematic partial section view of a flexible unit of a flexible body according to an embodiment of the present disclosure.

FIG. 1 is a schematic partial section view of an example structure of a flexible unit 100 of a flexible body according to an embodiment of the present disclosure. Here, the flexible unit 100 comprises a first electrode 11, a second electrode 12, an electroactive polymer layer 13, and a thin film transistor (T), wherein a source electrode (s) or a drain electrode (d) of the thin film transistor (T) is electrically connected to the second electrode 12. The first electrode 11 and the second electrode 12 are configured to provide an electric field acting on the electroactive polymer layer 13, and the electroactive polymer layer 13 is configured to deform in response to the electric field provided by the first electrode 11 and the second electrode 12.

For the flexible body provided in the embodiments of the present disclosure, the electroactive polymer layer thereof may deform under the action of the electric field provided by the first electrode and the second electrode, and the above-mentioned electric field may be generated by applying an external voltage to the first electrode and the second electrode and be controlled by the external voltage and the thin film transistor. For example, external voltages with different waveforms can generate electric fields in different directions or with different intensities between the first electrode and the second electrode. In addition, average amplitude of the external voltage can be modulated by controlling the "On" or "Off" state of the thin film transistor, thereby allowing the flexible unit to deform as desired, such as to expand or shrink. Therefore, such a flexible body has a wide variety of application scenarios. For example, the flexible body can be applied in a robot as a constituent structure of an artificial muscle. At this time, flexible stretching and shrinkage of the artificial muscle can be achieved without any motor or hydraulic system. Therefore, the application of the flexible body can greatly simplify the structure of the artificial muscle and its control system, and enhance the stretching and shrinkage flexibility of the artificial muscle, thereby improving the overall performance of the robot. Similarly, such a flexible body can also be used in an artificial limb to improve the flexibility or convenience when user walks or moves. It can be understood from the above discussion that the expanding process of the flexible body is actually a process to convert an electric energy to a mechanical energy. The mechanical energy has a relatively low intensity and a mild release process, and the expanding process can provide a mild impact force to an external object. Therefore, the flexible body can also be applied in any circumstance in need of such a mild impact force, including, but not limited to, an electrical massage chair, a transmitter, and so on.

Figure 2:
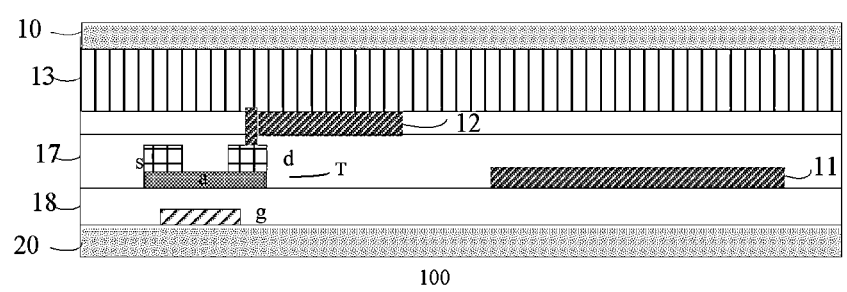
FIG. 2 shows a schematic partial section view of a flexible unit of a flexible body according to another embodiment of the present disclosure.

In the example of FIG. 1, the flexible unit 100 comprises a first flexible substrate 10 and a second flexible substrate 20 opposite to each other, wherein the first flexible substrate 10 and the second flexible substrate 20 can serve as an encapsulating structure of the flexible unit. The first electrode 11 and the second electrode 12 are respectively arranged on either side of the electroactive polymer layer 13. Alternatively, in another embodiment, as shown in FIG. 2, the first electrode 11 and the second electrode 12 may be arranged on the same side of the electroactive polymer layer 13, and the first electrode 11 and the second electrode 12 may be separated by an insulating layer (for example, a first insulating layer 17). It can be understood that, in this case, the electroactive polymer layer 13 will deform under the action of the electric field generated by the first electrode 11 and the second electrode 12. In these embodiments, all of different arrangements of the first electrode 11 and the second electrode 12 allow the first and second electrodes to generate an electric field acting on the electroactive polymer layer, thereby enabling deformation of the electroactive polymer layer.

Figure 3:
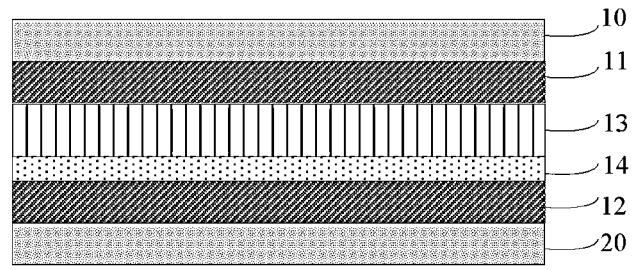
FIG. 3 shows a schematic partial section view of a flexible unit of a flexible body according to still another embodiment of the present disclosure.

The electroactive polymer layer 13 may comprise an electron-type electroactive polymer or an ion-type electroactive polymer, and the type of the electroactive polymer is not limited in the present disclosure. In the embodiments where the electroactive polymer in the electroactive polymer layer is an ion-type electroactive polymer, the flexible unit 100 further comprises an electrolyte solution layer in contact with the ion-type electroactive polymer layer. As shown in FIG. 3, the flexible unit of the flexible body provided in the embodiments of the present disclosure comprises: a first flexible substrate 10 and a second flexible substrate 20 opposite to each other; a first electrode 11 and a second electrode 12 between the first flexible substrate 10 and the second flexible substrate 20; an ion-type electroactive polymer layer 13 between the first electrode and the second electrode; and an electrolyte solution layer 14 in contact with the ion-type electroactive polymer layer 13. It can be understood that, in some embodiments, the flexible body may have no thin film transistor, and in such embodiments, the flexible units in the flexible body deform directly in response to the change of external voltage. Therefore, the term "flexible body" mentioned herein generally refers to a structure which can deform under the action of an external voltage and at least comprises a first electrode, a second electrode and an electroactive polymer layer as mentioned previously. The ion-type electroactive polymer can be oxidized under the action of an electric field with a relatively low intensity. Therefore, in this instance, the expansion and shrinkage of the flexible body can be achieved at a relatively low external voltage. The components of the ion-type electroactive polymer may include, for example, polyaniline, polypyrrole, polythiophene, and so on. The electrolyte solution in the flexible body may include, but not limited to, hydrochloric acid, sulfuric acid, perchloric acid, or sodium chloride solution.

The deformation process of the flexible unit 100 as shown in FIG. 3 will be illustrated below. When the flexible body is electrically connected to a power supply to generate a voltage difference between the first electrode and the second electrode, an electric field can be formed between the first electrode and the second electrode. The electroactive polymer in the electroactive polymer layer 13 is oxidized under the action of the electric field, resulting in positive charges on the polymer backbone. In order to maintain electric neutrality, anions in the electrolyte solution layer 14 will pass into the electroactive polymer layer to neutralize the positive charges generated by oxidation. Since all ions (including anions and cations) in the electrolyte solution layer 14 are solvated, solvent associated with the anions will also pass into the electroactive polymer layer together with the anions, resulting in volume expansion of the electroactive polymer layer and finally leading to expansion of the whole flexible unit. It can be understood that the higher the electric field intensity between the first electrode and the second electrode, the higher the oxidization degree of the polymer in the electroactive polymer layer 13 is, and the higher the expansion degree of the flexible unit is. When the voltage applied to the first electrode and the second electrode is removed, the polymer in the electroactive polymer layer 13 is reduced. The reduction is actually an electron gain process. Then, anions in the electroactive polymer layer 13 are discharged so as to maintain electric neutrality. Likewise, solvent associated with the anions is also discharged from the electroactive polymer layer 13 together with the anions. As a result, the volume of the electroactive polymer layer shrinks, such that the whole flexible body is in a shrinking state.

It can be understood that the flexible units 100 schematically shown in FIG. 1 to FIG. 3 are for the convenience of understanding the deformation process of the flexible unit as described above, and will not limit the shape or appearance of the flexible body in any way. The flexible body or the flexible unit may have corresponding morphology or dimension according to different application scenarios, which is not limited herein. In addition, although FIG. 3 shows that the electrolyte solution layer 14 is below the electroactive polymer layer 13, this also will not limit the protection scope of the present application. The electrolyte solution layer 14 and the electroactive polymer layer 13 may have any relative position relationship, as long as the electrolyte solution layer 14 is in contact with the electroactive polymer layer 13 such that ions in the electrolyte solution can pass into the electroactive polymer layer.

Figure 4:
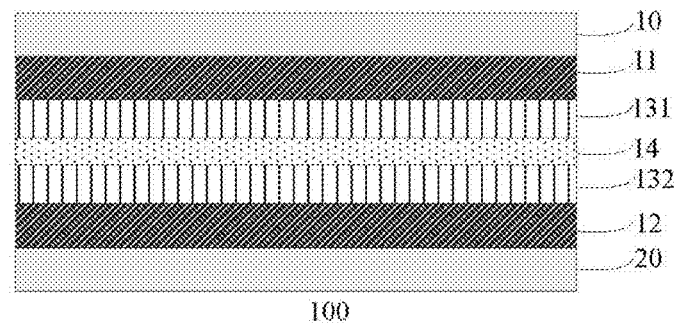
FIG. 4 shows a schematic partial section view of a flexible unit of a flexible body according to yet another embodiment of the present disclosure.

Next, reference is made to FIG. 4. According to another embodiment of the present disclosure, the electroactive polymer layer comprises a first electroactive polymer sub-layer 131 and a second electroactive polymer sub-layer 132, and the electrolyte solution layer 14 is between the first electroactive polymer sub-layer 131 and the second electroactive polymer sub-layer 132. In this embodiment, since the electrolyte solution layer is between the first electroactive polymer sub-layer and the second electroactive polymer sub-layer, that is, the electrolyte solution is surrounded by the electroactive polymer, there is a larger contact area between the electrolyte solution and the electroactive polymer. When the flexible body receives the external voltage to work, more ions in the electrolyte solution will pass into the electroactive polymer layer, thereby achieving a higher degree of expansion and shrinkage at the same external voltage. This further increases the flexibility of the device using the flexible body and facilitates improvement on the energy utilization efficiency.

Further, in another embodiment, the electroactive polymer layer may be doped with a movable anion (for example, $ClO_4^-$ and so on). As such, the conductivity of the electroactive polymer layer is increased, which is beneficial for increasing the expansion and shrinkage speed of the flexible body in response to the external voltage. As a result, the response rate of the device using the flexible body is facilitated.

Based on the embodiment as shown in FIG. 4, it can be understood that, in another embodiment, the electroactive polymer layer may comprise N electroactive polymer sub-layers, the electrolyte solution layer may comprise N−1 electrolyte solution sub-layers, and each electrolyte solution sub-layer is located between two adjacent electroactive polymer sub-layers, wherein N is an integer greater than 1. Optionally, in still another embodiment, the electroactive polymer layer may comprise M electroactive polymer sub-layers, the electrolyte solution layer may comprise M or M+1 electrolyte solution sub-layers, and the electrolyte solution sub-layers and the electroactive polymer sub-layers are alternately arranged, wherein M is a positive integer. That is, in some embodiments, the electrolyte solution layer is formed from a plurality of electrolyte solution sub-layers, the electroactive polymer layer is formed from a plurality of electroactive polymer sub-layers, and these electrolyte solution sub-layers and electroactive polymer sub-layers are alternately arranged. The upper limits for M and N are not particularly limited, and generally, M or N may be 50 or less, 20 or less, or 10 or less.

Referring to FIG. 1 or FIG. 2 again, in some embodiments, each flexible unit of the flexible body comprises a first insulating layer 17 overlaying the thin film transistor, and the second electrode 12 is formed on a side of the first insulating layer 17 away from the thin film transistor, wherein the first insulating layer 17 is provided with a via hole, and the source electrode or drain electrode of the thin film transistor is electrically connected to the second electrode 12 through the via hole. FIG. 1 or FIG. 2 also schematically shows the basic structure of single thin film transistor (T), wherein the thin film transistor (T) comprises a gate electrode (g), a source electrode (s), a drain electrode (d), and an active layer (a). The gate electrode (g) and the active layer (a) may be separated by an insulating layer, known as a gate insulating layer 18. The second electrode 12 is electrically connected to one of the source electrode and drain electrode of the thin film transistor (T) (for example, the drain electrode (d)), the other of the source electrode and drain electrode of the thin film transistor (T) may be electrically connected to an external power supply, and the first electrode 11 may be electrically connected to a reference potential. In the example of FIG. 1 or FIG. 2, the source electrode (s) of the thin film transistor (T) may be used for receiving the external voltage. Thus, the thin film transistor (T) may be used to drive the second electrode 12. When the gate electrode (g) of the thin film transistor receives a corresponding control signal to turn on the thin film transistor, it can transport the voltage from the power supply to the second electrode 12, forming an electric field between the second electrode 12 and the first electrode 11. The electric field causes the electroactive polymer layer between these two electrodes to deform. In this embodiment, the first insulating layer 17 provides a good protection for the thin film transistor, reducing adverse effect of the potential of the second electrode on the working performance of the thin film transistor. The configuration of the via hole in the first insulating layer enables that the first insulating layer will not influence the driving effect of the thin film transistor on the second electrode.

FIG. 1 or FIG. 2 schematically shows that a single thin film transistor and a single second electrode 12 are arranged in the flexible unit. However, in other embodiments, a plurality of thin film transistors and a plurality of second electrodes may be arranged. For example, in the embodiment of FIG. 5, the flexible unit of the flexible body comprises a thin film transistor array composed of a plurality of thin film transistors, a second electrode array composed of a plurality of second electrodes 12, and one or more first electrodes 11. The source electrode or drain electrode of each thin film transistor in the thin film transistor array is electrically connected to one respective second electrode 12 in the second electrode array, and the plurality of second electrodes in the second electrode array are arranged separately from each other and respectively corresponding to different positions of the electroactive polymer layer. For the thin film transistor array herein, a portion of the thin film transistors may be controlled in an "On" state, and the other portion of the thin film transistors may be in an "Off" state. That is, the thin film transistors at different positions may be independently controlled as desired, such that there is an electric field between a portion of the second electrodes 12 and the first electrode 11, and there is no electric field between the other portion of the second electrodes 12 and the first electrode 11, thereby achieving local deformation of the flexible body.

In such embodiments, the electric field acting on the electroactive polymer layer may be provided by one first electrode together with at least two second electrodes. In the example shown in FIG. 5, the thin film transistor array and the second electrode array are arranged on the second flexible substrate 20, and the first electrode 11 is arranged on a surface of the first flexible substrate 10 facing the second flexible substrate 20, and corresponds to the plurality of second electrodes in the second electrode array.

Figure 6:
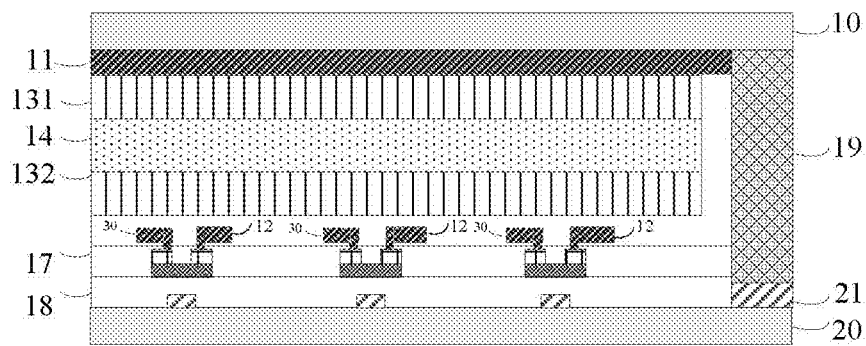
FIG. 6 shows a schematic partial section view of a flexible unit of a flexible body according to yet another embodiment of the present disclosure.

In order to form an electric field between the first electrode and the second electrode, in some embodiments, a power conversion device capable of generating a desired voltage may be provided in the flexible unit. For example, as shown in FIG. 6, in some embodiments, the flexible unit comprises a data voltage generator 30 configured to be electrically connected to the source electrodes or drain electrodes of the thin film transistors in the thin film transistor array to provide different data voltages (also referred to as "first voltages" herein) to the second electrodes. In the example shown in FIG. 6, the data voltage generator 30 is electrically connected to the source electrode or drain electrode of the thin film transistor through the via hole, although the data voltage generator 30 may be electrically connected to the source electrode or drain electrode of the thin film transistor in other ways. In addition, for simplicity, FIG. 6 shows that (a partial structure of) the data voltage generator 30 is arranged in the same layer as the second electrode, but the arrangement of the data voltage generator 30 is not limited thereto.

In such an embodiment, a portion of the thin film transistors in the thin film transistor array may be controlled in an "On" state, and the other portion of the thin film transistors may be in an "Off" state. That is, by independently controlling the thin film transistors at different positions, it can be enabled that there is an electric field between a portion of the second electrodes 12 and the first electrode 11, and there is no electric field between the other portion of the second electrodes 12 and the first electrode 11, thereby achieving local deformation of the flexible body. That is, according to practical requirements, some regions of the flexible body may be controlled in an expanding state, and the other regions may be controlled in a shrinking state, to achieve a desired stretching and shrinking effect. Furthermore, based on the supply voltage, the data voltage generator 30 can generate data voltages with different amplitudes, which are then provided to different thin film transistors and corresponding second electrodes. Thus, electric fields with different intensities can be formed between different second electrodes and the first electrode, finally resulting in different degrees of expansion in different regions of the flexible body. It can be understood that the expansion and shrinkage of the flexible body can be changed continuously according to the gate electrode control signal of the thin film transistor and the data voltage provided by the data voltage generator. Therefore, the embodiment further increases the stretching and shrinking flexibility of the flexible body, enabling more flexible and fine movement of the device (for example, robot, massage chair and so on) using the flexible body.

Figure 5:
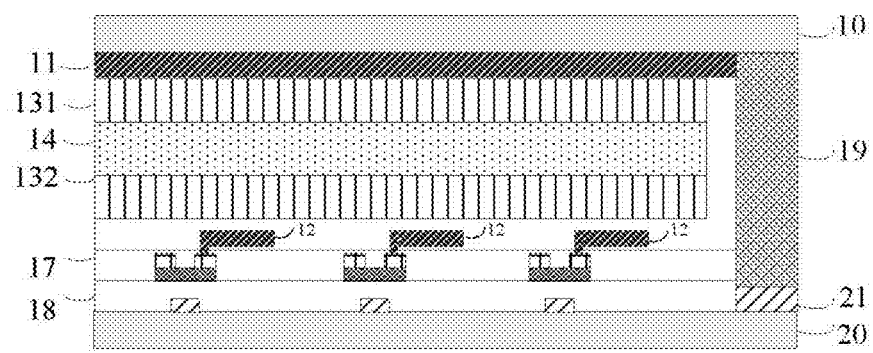
FIG. 5 shows a schematic partial section view of a flexible unit of a flexible body according to yet another embodiment of the present disclosure.

As shown in FIG. 5, according to some embodiments of the present disclosure, the thin film transistor is arranged on the second flexible substrate 20, the flexible unit further comprises a first insulating layer 17 overlaying the thin film transistor, and the second electrode 12 is formed on the first insulating layer 17. The second electrode 12 may be connected to the drain electrode (d) of the thin film transistor through the via hole in the first insulating layer 17. Of course, it can be understood by those skilled in the art that the gate electrode (g) and the active layer (a) of the thin film transistor are also separated by an insulating layer, known as a gate insulating layer 18.

According to some embodiments of the present disclosure, as shown in FIG. 5, the first electrode 11 may act as a common electrode, and the flexible unit may further comprise a common electrode wire 21 on the second flexible substrate 20, wherein the common electrode wire 21 is connected to the common electrode 11 through a conductive adhesive 19. Therefore, the common electrode wire 21 has the same potential (for example, the reference potential) as the common electrode 11. The common electrode wire 21 may be formed from the same material as the gate electrode (g) of the thin film transistor by one-step patterning process (i.e., only using one mask plate). As such, the fabrication efficiency of the flexible body can be increased, and the production cost can be reduced.

In some embodiments, the conductive adhesive 19 is a carbon-based conductive silicone, for example, a photo-sensitive carbon-based conductive silicone. The selection of the photo-sensitive carbon-based conductive silicone is beneficial for ensuring the reliability of the connection between the first substrate and the second substrate, and contributes to preventing the first substrate and the second substrate from separation due to the stretching and shrinking deformation of the electroactive polymer layer. In addition, the photo-sensitive carbon-based conductive silicone can avoid or alleviate evaporation of the electrolyte solution during packaging of the flexible body.

Figure 7:
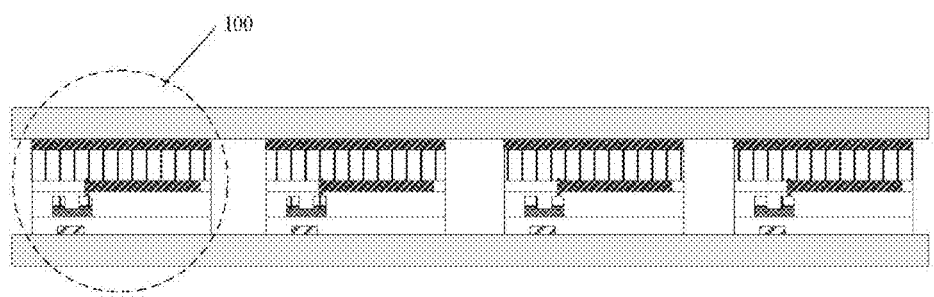
FIG. 7 shows a schematic partial section view of a flexible body according to an embodiment of the present disclosure.

According to some embodiments of the present disclosure, the flexible body comprises a plurality of flexible units, and these flexible units may be arranged in any suitable mode to meet different requirements. For example, in the embodiment as shown in FIG. 7, the flexible units 100 in the flexible body are arranged along an extending direction of the electroactive polymer layer. These flexible units 100 may be disposed between two opposite flexible substrates. Therefore, different controls may be performed on different flexible units 100 as desired to cause different deformation. Thus, desired deformation of the whole flexible body can be achieved.

Figure 8:
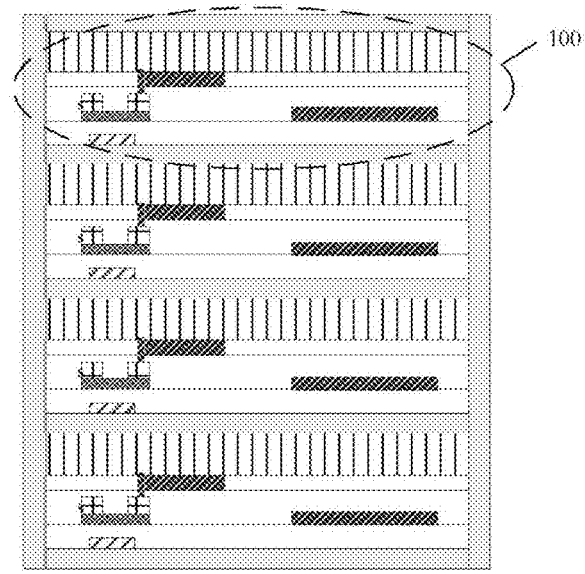
FIG. 8 shows a schematic partial section view of a flexible body according to another embodiment of the present disclosure.

Optionally, in another embodiment, as shown in FIG. 8, the flexible units 100 in the flexible body are arranged in lamination in a direction perpendicular to an extending direction of the electroactive polymer layer in the flexible units 100. Adjacent flexible units 100 may be separated by a flexible material layer. Since the deformation degree in the direction perpendicular to the extending direction of the electroactive polymer layer in the flexible units 100 is greater than the deformation degree along the extending direction of the electroactive polymer layer at the same external voltage, less flexible units are arranged in the direction perpendicular to the extending direction of the electroactive polymer layer in the flexible units, and desired deformation degree can also be achieved in that direction, as a result, the utilization efficiency is improved and the cost is saved. Of course, in other embodiments, the flexible units 100 in FIG. 8 may be replaced by the flexible units 100 of the flexible body as shown in FIG. 7.

As described previously, the flexible body provided in the embodiments of the present disclosure can be used as a constituent structure of an artificial muscle. Therefore, other embodiments of the present disclosure provide an artificial muscle comprising the flexible body according to any one of the preceding embodiments. The artificial muscle using the flexible body provided in the embodiments of the present disclosure has a simpler structure, avoids complicated control system, and can achieve more flexible stretching and shrinking.

In addition, yet another embodiment of the present disclosure provides a method for fabricating the flexible body described in the preceding embodiments, comprising: providing a rigid substrate; fabricating the flexible body according to the preceding embodiments on the rigid substrate; and separating the flexible body from the rigid substrate. As such, the scale production of the flexible body can be achieved, and the fabrication efficiency of the flexible body can be improved.

A particular process for fabricating single flexible unit will be illustrated below with reference to FIG. 5 again. First, a gate electrode (g) of the thin film transistor and a common electrode wire 21 may be fabricated on a second flexible substrate 20 by processes of photoresist applying, exposing, developing, etching and so on. Then, a gate insulating layer 18, and an active layer (a) and source/drain electrodes of the thin film transistor are fabricated sequentially. Next, a first insulating layer 17 overlaying the thin film transistor is fabricated, and a via hole is formed in the first insulating layer 17. Subsequently, a second electrode 12 is formed on the first insulating layer 17 by sputtering a metal material, such that the second electrode 12 is connected to the source/drain electrode of the thin film transistor through the via hole in the first insulating layer 17. After the above steps are completed, or before carrying out the above steps, the following additional steps may be performed: fabricating a first electrode 11 sequentially on a first flexible substrate 10, then applying an electroactive polymer with a thickness on the first electrode 11, and injecting an electrolyte solution into the electroactive polymer. At this time, some layer structures have been respectively fabricated on the first flexible substrate and the second flexible substrate. Next, the first flexible substrate and the second flexible substrate are combined in alignment with each other with a conductive adhesive 19, such that the first electrode 11 and the common electrode wire 21 are connected through the conductive adhesive 19, thereby obtaining the flexible body as shown in FIG. 5. In some embodiments, an organic insulating material may be used as a material for fabricating the insulating layer in the above steps, and a coupling agent may be used for connecting an inorganic material to an organic material. This may be beneficial for long lasting stability of the layer structures on the flexible substrate, such that the flexible body has a good bending deformation stability.

Other embodiments of the present disclosure provide a method for controlling a flexible body to deform, wherein the flexible body may be the flexible body according to any one of the preceding embodiments. The method may comprise steps of: applying a first voltage to the source electrode or drain electrode of the thin film transistor; applying a second voltage to the first electrode; changing the first voltage to modulate the electric field acting on the electroactive polymer layer, thereby controlling the flexible body to deform accordingly.

Further, in another embodiment, the flexible unit comprises a thin film transistor array composed of a plurality of thin film transistors, a second electrode array composed of a plurality of second electrodes, one or more first electrodes, and a data voltage generator electrically connected to the source electrodes or drain electrodes of the plurality of thin film transistors in the thin film transistor array, and the method for controlling the flexible body to deform comprises: providing different first voltages to the thin film transistors by the data voltage generator; applying the second voltage to the first electrode; changing the first voltage provided by the data voltage generator to modulate the electric field acting on the electroactive polymer layer, thereby controlling the flexible body to deform accordingly.

According to some embodiments of the present disclosure, the flexible body comprises a plurality of flexible units, and the method for controlling the flexible body to deform comprises: providing different first voltages to the thin film transistors in one respective flexible unit by a plurality of data voltage generators respectively; applying the second voltage to the first electrode; changing the first voltages provided by the plurality of data voltage generators to modulate the electric field acting on the electroactive polymer layer, thereby controlling the flexible body to deform accordingly.

Although some exemplary embodiments of the present application have been specifically described above, other variations of the embodiments can be appreciated and achieved by those skilled in the art when implementing the claimed invention, according to the investigation on the drawings, the disclosure and the claims. In the claims, the word "comprise" does not exclude the presence of other elements, and each claim does not limit the number of the technical features as recited therein. Although some features are recited in different dependent claims, the present application is intended to cover embodiments in which these features are combined together.

What is claimed is:

1. A flexible body comprising one or more flexible units, wherein each of the flexible units comprises: a first electrode, a second electrode, an electroactive polymer layer, and a thin film transistor, wherein a source electrode or a drain electrode of the thin film transistor is electrically connected to the second electrode;
    wherein the first electrode and the second electrode are configured to provide an electric field acting on the electroactive polymer layer, and the electroactive polymer layer is configured to deform in response to the electric field provided by the first electrode and the second electrode; and
    wherein the electroactive polymer layer comprises an ion-type electroactive polymer, and the flexible unit further comprises an electrolyte solution layer in contact with the electroactive polymer layer,
        wherein the electroactive polymer layer comprises N electroactive polymer sub-layers, the electrolyte solution layer comprises N−1 electrolyte solution sub-layers, and each of the electrolyte solution sub-layers is arranged between two adjacent electroactive polymer sub-layers, wherein N is an integer greater than 1.

2. The flexible body according to claim 1, wherein the first electrode and the second electrode are respectively arranged on opposite sides of the electroactive polymer layer, or the first electrode and the second electrode are arranged on the same side of the electroactive polymer layer.

3. The flexible body according to claim 1, wherein the electroactive polymer layer is doped with a movable anion.

4. The flexible body according to claim 1, wherein the flexible unit further comprises a first insulating layer overlaying the thin film transistor, wherein the second electrode is formed on a side of the first insulating layer away from the thin film transistor, the first insulating layer is provided with a via hole, and the source electrode or drain electrode of the thin film transistor is electrically connected to the second electrode through the via hole.

5. The flexible body according to claim 1, wherein the flexible unit comprises a thin film transistor array composed of a plurality of thin film transistors, a second electrode array composed of a plurality of second electrodes, and one or more first electrodes, wherein a source electrode or a drain electrode of each thin film transistor in the thin film transistor array is electrically connected to one respective second electrode in the second electrode array, and the plurality of second electrodes in the second electrode array are arranged separately and respectively corresponding to different positions of the electroactive polymer layer.

6. The flexible body according to claim 5, wherein one first electrode together with at least two second electrodes provides an electric field acting on the electroactive polymer layer.

7. The flexible body according to claim 6, wherein the flexible unit further comprises a data voltage generator configured to be electrically connected to the source electrodes or drain electrodes of the plurality of thin film transistors in the thin film transistor array to provide different first voltages to the second electrodes.

8. The flexible body according to claim 1, wherein the flexible body comprises a plurality of flexible units arranged along an extending direction of the electroactive polymer layer.

9. The flexible body according to claim 8, wherein the first electrode is a common electrode.

10. The flexible body according to claim 9, wherein the flexible unit further comprises a common electrode wire on the same side as the thin film transistor, and the common electrode wire is connected to the common electrode through a conductive adhesive.

11. The flexible body according to claim 1, wherein the flexible body comprises a plurality of flexible units arranged in lamination in a direction perpendicular to an extending direction of the electroactive polymer layer.

12. The flexible body according to claim 1 configured for use in an artificial muscle, an artificial limb, a massage chair, or a transmitter.

13. A method for controlling the flexible body according to claim 1 to deform, comprising:
    applying a first voltage to the source electrode or drain electrode of the thin film transistor;
    applying a second voltage to the first electrode; and
    changing the first voltage to modulate the electric field acting on the electroactive polymer layer, thereby controlling the flexible body to deform accordingly.

14. The method according to claim 13, wherein the flexible unit comprises a thin film transistor array composed of a plurality of thin film transistors, a second electrode array composed of a plurality of second electrodes, one or more first electrodes, and a data voltage generator electrically connected to the source electrodes or drain electrodes of the plurality of thin film transistors in the thin film transistor array, and the method comprises:
    providing first voltages to the plurality of thin film transistors in one-to-one correspondence by the data voltage generator, wherein the first voltages have different voltage values from each other;
    applying the second voltage to the one or more first electrodes; and
    changing the first voltage provided by the data voltage generator to modulate the electric field acting on the electroactive polymer layer, thereby controlling the flexible body to deform accordingly.

15. The flexible body according to claim 13, wherein the flexible body comprises a plurality of flexible units, and the method comprises:
    providing first voltages to the thin film transistors in one respective flexible unit in one-to-one correspondence by a plurality of data voltage generators, wherein the first voltages have different voltage values from each other;
    applying the second voltage to the first electrode; and
    changing the first voltages provided by the plurality of data voltage generators to modulate the electric field acting on the electroactive polymer layer, thereby controlling the flexible body to deform accordingly.

16. The method according to claim 13, wherein the deformation of the flexible body comprises expansion and shrinkage.

17. A flexible body comprising one or more flexible units, wherein each of the flexible units comprises: a first electrode, a second electrode, an electroactive polymer layer, and a thin film transistor, wherein a source electrode or a drain electrode of the thin film transistor is electrically connected to the second electrode;

wherein the first electrode and the second electrode are configured to provide an electric field acting on the electroactive polymer layer, and the electroactive polymer layer is configured to deform in response to the electric field provided by the first electrode and the second electrode; and wherein the electroactive polymer layer comprises an ion-type electroactive polymer, and the flexible unit further comprises an electrolyte solution layer in contact with the electroactive polymer layer, wherein the electroactive polymer layer comprises M electroactive polymer sub-layers, the electrolyte solution layer comprises M or M+1 electrolyte solution sub-layers, and the electrolyte solution sub-layers and the electroactive polymer sub-layers are alternately arranged, wherein M is a positive integer.

18. A method for controlling the flexible body according to claim 17 to deform, comprising:

applying a first voltage to the source electrode or drain electrode of the thin film transistor;

applying a second voltage to the first electrode; and changing the first voltage to modulate the electric field acting on the electroactive polymer layer, thereby controlling the flexible body to deform accordingly.

* * * * *